United States Patent
Cha et al.

(10) Patent No.: US 8,691,012 B2
(45) Date of Patent: Apr. 8, 2014

(54) METHOD OF MANUFACTURING ZINC OXIDE NANOWIRES

(75) Inventors: Seung Nam Cha, Seoul (KR); Jae Eun Jang, Seoul (KR); Byong Gwon Song, Seoul (KR)

(73) Assignee: Samsung Electronics Co. Ltd. (KR)

( * ) Notice: Subject to any disclaimer, the term of this patent is extended or adjusted under 35 U.S.C. 154(b) by 1233 days.

(21) Appl. No.: 12/236,559

(22) Filed: Sep. 24, 2008

(65) Prior Publication Data

US 2009/0235862 A1 Sep. 24, 2009

(30) Foreign Application Priority Data

Mar. 24, 2008 (KR) .................. 10-2008-0026871

(51) Int. Cl.
*C30B 23/00* (2006.01)
*C30B 25/00* (2006.01)
(52) U.S. Cl.
USPC .............................................. 117/94; 117/84
(58) Field of Classification Search
None
See application file for complete search history.

(56) References Cited

U.S. PATENT DOCUMENTS

| 7,303,631 | B2* | 12/2007 | Conley et al. | 117/94 |
| 2006/0090693 | A1* | 5/2006 | Conley et al. | 117/101 |
| 2008/0081388 | A1* | 4/2008 | Yasseri et al. | 438/22 |
| 2008/0266556 | A1* | 10/2008 | Kamins et al. | 356/301 |
| 2009/0127540 | A1* | 5/2009 | Taylor | 257/14 |
| 2010/0104749 | A1* | 4/2010 | Zhao et al. | 427/241 |

OTHER PUBLICATIONS

Wang et al; "Photoluminescence study of ZnO films prepared by thermal oxidation of Zn metallic films in air" J. App. Physics, 94, 354-358.*

* cited by examiner

*Primary Examiner* — Bijay Saha
(74) *Attorney, Agent, or Firm* — Cantor Colburn LLP

(57) ABSTRACT

A method of manufacturing zinc oxide nanowires. A metal seed layer is formed on a substrate. The metal seed layer is thermally oxidized to form metal oxide crystals. Zinc oxide nanowires are grown on the metal oxide crystals serving as seeds for growth. The zinc oxide nanowires are aligned in one direction with respect to the surface of the substrate.

9 Claims, 7 Drawing Sheets

1μm

2μm

METHOD OF MANUFACTURING ZINC OXIDE NANOWIRES

This application claims priority to Korean Patent Application No. 10-2008-0026871, filed on Mar. 24, 2008, and all the benefits accruing therefrom under U.S.C. §119, the contents of which in their entirety are herein incorporated by reference.

BACKGROUND

1. Field

This disclosure relates to a method of manufacturing zinc oxide nanowires.

2. Description of the Related Art

Nanowires are ultrafine wires whose diameter is in the range of several to several hundreds of nanometers, and whose length is several hundred nanometers or on the order of micrometers or millimeters. Nanowires exhibit various physical properties depending on their diameter and length. Nanowires can be used to fabricate a variety of micro-devices using their small size, and have advantages due to their inherent directional electron mobility characteristics and optical properties, such as polarization.

At present, extensive research on nanowires is actively underway owing to their wide potential applications in next-generation electronic and photonic devices. Micro-devices using nanowires can provide several nanometers of circuit linewidth and is thus expected to realize a high degree of circuit integration. Accordingly, a great deal of study is being actively made on mass-production, alignment and highly-integrated array techniques for nanowires.

In particular, zinc oxide (ZnO) nanowires, as functional Group II-VI semiconductor nanomaterials which have a wide direct band gap of 3.37 eV and a large exciton binding energy of 60 mV, are drawing a great deal of attention for various semiconductor and photo applications.

In terms of applications of nanowires, alignment degree is one of important factors that determine the performance and integration degree of devices. Generally, the growth direction of ZnO nanowires is determined by crystal factors of the substrate. When ZnO nanowires are grown on an amorphous substrate, they are grown in random directions. Accordingly, control over growth direction of ZnO nanowires greatly affects applications of ZnO nanowires. A great deal of research is being made to accomplish growth direction control.

SUMMARY

Accordingly, exemplary embodiments of the present invention provide a method of manufacturing zinc oxide nanowires wherein zinc oxide nanowires can be grown such that they are aligned perpendicular to the surface of the substrate, and manufacturing costs can be reduced. Example embodiments provide a method for fabricating a device comprising zinc oxide nanowires.

Disclosed herein is a method of manufacturing zinc oxide nanowires, including: forming a metal seed layer on a substrate; pretreating the metal seed layer through thermal oxidation to form metal oxide crystals; and growing zinc oxide nanowires on the metal oxide crystals, the metal oxide crystals serving as seeds for the growth of the zinc oxide nanowires to be aligned in one direction with respect to the surface of the substrate.

The zinc oxide nanowires may be grown perpendicular to the surface of the substrate. The growth of the zinc oxide nanowires may be carried out by thermal chemical vapor deposition or hydrothermal synthesis.

The substrate may be an amorphous substrate or a substrate coated with amorphous $SiO_2$. The substrate may be made of at least one material selected from the group consisting of silicon, glass, indium tin oxide (ITO), mica, graphite, molybdenum sulfide, copper, zinc, aluminum, stainless steel, magnesium, iron, nickel, gold, silver and plastics.

The metal seed layer may be a zinc film. The metal seed layer has a thickness of about 10 nm to about 50 nm, more desirably 30 nm.

The metal seed layer is oxidized and crystallized through heating in the pretreatment process, thereby controlling the growth direction of nanowires.

Disclosed herein is a device comprising zinc oxide nanowires manufactured by the method according to the example embodiment. The device may include a thin film transistor, a light-emitting diode or a photonic device. The device may be fabricated by a method comprising the manufacturing method of zinc oxide nanowires according to the example embodiment.

BRIEF DESCRIPTION OF THE DRAWINGS

Exemplary embodiments of the present invention will be more clearly understood from the following detailed description taken in conjunction with the accompanying drawings. FIGS. 1 to 9 represent exemplary embodiments of the present invention as described herein.

FIG. 1 is a flow diagram illustrating a method of manufacturing zinc oxide nanowires in accordance with an exemplary embodiment of the present invention;

FIG. 2 is a flow diagram illustrating a method of manufacturing zinc oxide nanowires in accordance with an exemplary embodiment of the present invention;

FIG. 3 is a flow diagram illustrating a method of manufacturing zinc oxide nanowires in accordance with an exemplary embodiment of the present invention;

FIG. 4 is a schematic diagram illustrating thermal chemical vapor deposition equipment used for the method of manufacturing zinc oxide nanowires according to an exemplary embodiment of the present invention;

FIG. 6 is a graph showing the results of X-ray diffraction (XRD) measurement of zinc oxide nanowires manufactured according to an exemplary embodiment of the present invention;

FIG. 7 is a graph showing the results of photoluminescence (PL) measurement of zinc oxide nanowires manufactured according to an exemplary embodiment of the present invention;

FIG. 9 is a graph showing the results of X-ray diffraction measurement of zinc oxide nanowires manufactured according to an exemplary embodiment of the present invention.

DETAILED DESCRIPTION OF EMBODIMENTS

Figure 1:
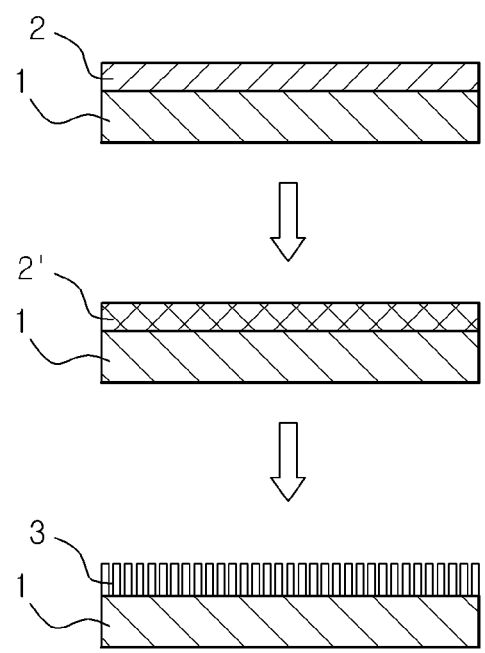

Hereinafter, exemplary embodiments will be described in more detail with reference to the accompanying drawings.

It should be noted that the drawings are intended to illustrate the general characteristics of methods, structure and/or materials utilized in certain exemplary embodiments and to supplement the written detailed description provided below. These drawings are, however, not to scale and may not precisely reflect the precise structural or performance characteristics of any given embodiment, and should not be interpreted as limiting the range of values or properties encompassed by exemplary embodiments. For example, the relative thicknesses and positioning of molecules, layers, regions and/or structural elements may be reduced or exaggerated for clarity.

Reference now should be made to the drawings, in which the same reference numerals are used throughout the different drawings to designate the same or similar components. In the drawings, the thicknesses and widths of layers are exaggerated for clarity. Exemplary embodiments may, however, be embodied in many different forms and should not be construed as limited to the exemplary embodiments set forth herein.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements of the device described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations which are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes which result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments of the present invention belong. It will be further understood that terms, such as those defined in commonly used dictionaries, should be interpreted as having a meaning which is consistent with their meaning in the context of the relevant art and will not be interpreted in an idealized or overly formal sense unless expressly so defined herein.

Exemplary embodiments of the present invention provide a method of manufacturing zinc oxide nanowires comprises: forming a metal seed layer on a substrate; pretreating the metal seed layer through thermal oxidation to form metal oxide crystals; and growing zinc oxide nanowires on the metal oxide crystals. Here, the metal oxide crystals act seed for the growth of the zinc oxide nanowires such that the zinc oxide nanowires are aligned in one direction with respect to the surface of the substrate.

Figure 2:
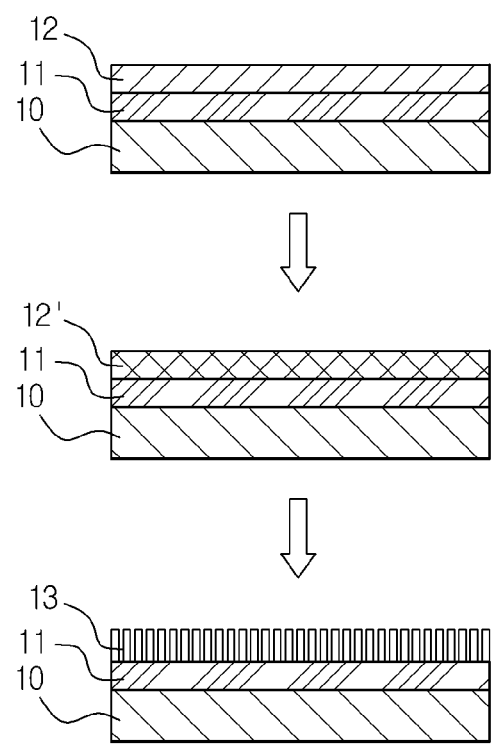
Figure 3:
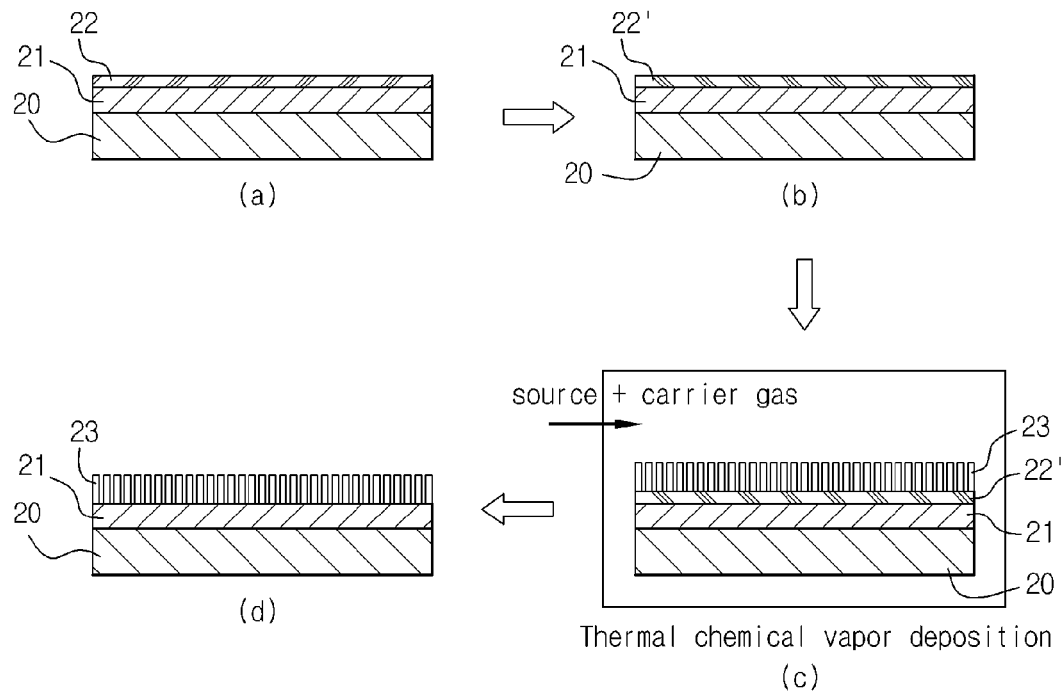

FIGS. 1 to 3 are flow diagrams illustrating a method of manufacturing zinc oxide nanowires according to exemplary embodiments.

Referring to FIG. 1, the method of manufacturing zinc oxide nanowires will be illustrated. First, a metal seed layer 2 containing a plurality of seeds is formed on a substrate 1. Second, the metal seed layer 2 is pretreated through thermal oxidation (the term "thermal oxidation" used herein refers to oxidation obtained by heating) to form metal oxide crystals. Third, zinc oxide nanowires 3 are grown on the metal oxide crystals such that the zinc oxide nanowires 3 are aligned in one direction with respect to the substrate.

The substrate 1 that can be used in the exemplary method is an amorphous substrate or a generally-used substrate on which an amorphous film such as a:$SiO_2$ is formed. That is, the substrate used herein refers to an amorphous substrate or a given substrate on which an amorphous film is formed. The type of the substrate 1 used herein may be a silicon, plastic or glass substrate, but is not particularly limited thereto. Examples of materials for the substrate include, but are not limited to, silicon, glass, indium tin oxide (ITO), mica, graphite, molybdenum sulfide, metals (such as copper, zinc, aluminum, stainless steel, magnesium, iron, nickel, gold and silver) and plastics (such as polyimide, polyester, polycarbonate and acrylic resins). More specifically, FIG. 1 shows a flow diagram illustrating a method of manufacturing zinc oxide nanowires using an amorphous substrate 1. FIGS. 2 and 3 show flow diagrams illustrating a method of manufacturing zinc oxide nanowires using a substrate 10 or 20 on which an amorphous $SiO_2$ film 11 or 21 is formed.

Referring to FIGS. 2 and 3, the metal seed layer 12 or 22 used in the exemplary method may be a zinc film. The metal seed layer 12 or 22 is formed on the substrate 10 or 20, to a thickness of 10 nm to 100 nm, more desirably 10 nm to 50 nm, most desirably 30 nm. Any common technique may be employed, without limitation, to form the metal seed layer on the substrate 10 or 20. In particular, in the case where a zinc film is used as the metal seed layer 12 or 22, the zinc film is formed using sputtering, thereby realizing reduced manufacturing costs, as compared to other deposition techniques such as PLD, MOCVD and MBE that require high-cost deposition equipment.

In the pretreatment step, the metal seed layer 11 or 22 formed on the amorphous $SiO_2$ film is oxidized by heating and then crystallized to produce metal oxide crystals such as zinc oxide crystals, which forms a pretreated metal seed layer 12' or 22'. In the subsequent step, zinc oxide nanowires 13 or 23 are grown in one direction on the pretreated metal seed layer 12' or 22'. That is, crystal planes of the seeds determine the growth direction of nanowires. The pretreatment may be carried out by heating the metal seed layer 12 or 22 at about 350 to about 400° C. for about 30 to about 60 minutes, thereby forming a pretreated metal seed layer 12' or 22' including metal oxide crystals, for example, zinc oxide crystals.

In the exemplary embodiments, the metal seed layer is pretreated on the amorphous substrate, thereby growing the nanowires along the crystal orientation of the pretreated metal seed layer. That is, in order to produce the aligned nanowires, the method does not employ a substrate with a specific crystal orientation, but employs the crystal orientation of seeds obtained through the pretreatment of the metal seed layer to produce aligned nanowires, independent of the crystallinity of the substrate. This method uses the phenomenon that the nanowires exhibit superior crystal growth characteristics (epitaxial growth) along the perpendicular direction with respect to crystal planes. Expensive sapphire substrates are generally used to obtain aligned ZnO nanowires. The reason for generally using the sapphire substrates is because the crystal orientation of sapphire substrates determines the growth direction of ZnO nanowires. However, according to the exemplary method, nanowires are grown, which are aligned in one direction with respect to the crystal orientation of seeds, through a pretreatment process of the metal seed layer. Accordingly, instead of expensive sapphire substrates, various substrates including silicon substrates can be used to produce aligned nanowires. As a result, it is possible to realize production cost savings and functional improvement of devices to which ZnO nanowire is applicable.

In Exemplary embodiments, the metal seed layer formed on the substrate is pretreated by heating, and zinc oxide nanowires are then grown on the pretreated metal seed layer, thereby manufacturing zinc oxide nanowires aligned in one direction with respect to the substrate. The zinc oxide nanowires may be grown by thermal chemical vapor deposition or hydrothermal synthesis, but the present invention is not particularly limited thereto.

A variety of techniques have been attempted to synthesize zinc oxide nanowires. The most widely known technique is thermal chemical vapor deposition. Thermal chemical vapor deposition is a technique which gasifies a solid ZnO source by heating to grow ZnO nanowires from seeds formed in or on a substrate. The synthesis of the zinc oxide nanowires using the thermal chemical vapor deposition is made based on the following two mechanisms, i.e. vapor-liquid-solid (VLS) and vapor-solid (VS). In accordance with the VLS mechanism, gaseous zinc and oxygen are deposited in a metal catalyst having a eutectic point to synthesize zinc oxide nanowires. In accordance with the VS mechanism, gaseous zinc and oxygen are epitaxially grown on seeds.

Figure 4:
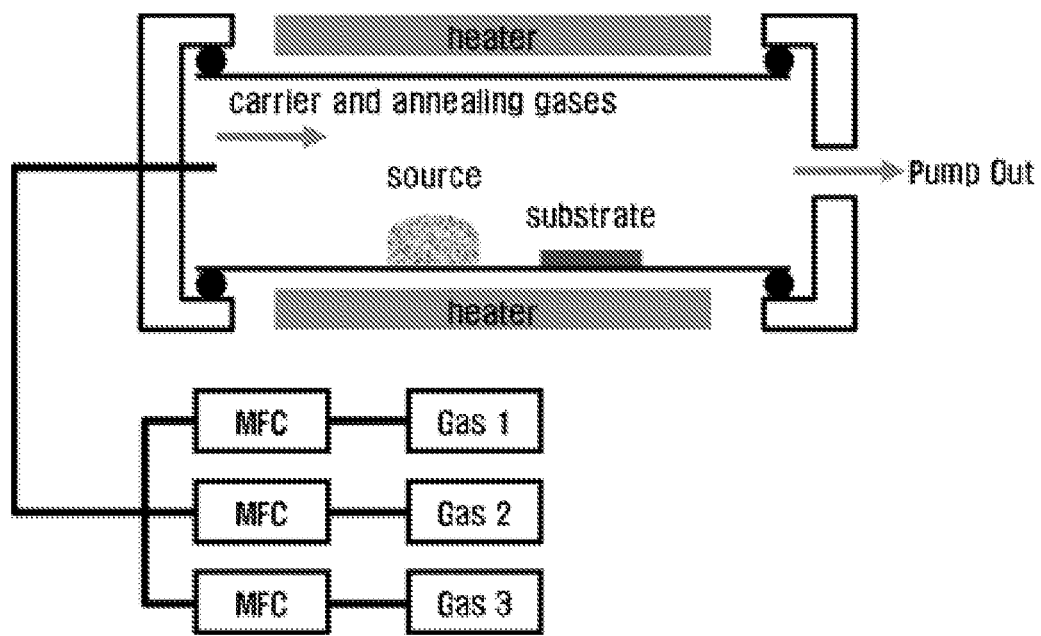

FIG. 4 is a schematic diagram illustrating thermal chemical vapor deposition equipment used for the method of manufacturing zinc oxide nanowires according to one embodiment.

The step of growing zinc oxide nanowires through thermal chemical vapor deposition includes the sub-steps of: allowing zinc to be vaporized and adsorbing the vaporous zinc on the crystal surface to produce nanowires.

In the case where nanowires are grown through thermal chemical vapor deposition, as shown in FIG. 4, a source material and a substrate are arranged such that they are spaced apart from each other by a predetermined distance, and a furnace is heated together with injection of a reactive or annealing gas thereinto. Referring to FIG. 4, a flow rate of the reactive gas is controlled by MFCs (Mass Flow Controller), but the thermal chemical vapor deposition equipment is not limited to such a structure. The source material used in this embodiment is zinc oxide. Generally, zinc oxide takes the form of a powder, pellet, plate or block. Powdery zinc oxide is preferred to increase the amount of zinc oxide gases vaporized at low temperatures. Furthermore, in order to improve low temperature processability, zinc oxide may be used in combination with a carbon powder. In this case, zinc oxide can be vaporized at relatively low temperatures and the reaction temperature can thus be lowered. The heating speed of the furnace may be about 5 to about 30° C./min.

In the heating and zinc oxide nanowire growth processes, a carrier gas is injected toward the substrate from the source powder. In one embodiment, an inert gas is used as the carrier gas. Examples of inert gases include, but are not limited to, argon, helium and nitrogen. In addition, the carrier gas may further contain a predetermined amount of oxygen to control the properties of zinc oxide nanowires. The carrier gas carries gaseous zinc and oxygen. When the gaseous zinc and oxygen are cooled and then grown epitaxially on the crystal surface of seeds, it is desirable to use an inert gas in order to increase the purity of the zinc oxide. The oxygen suspended in the inert gas such as argon reacts with the vaporous zinc gas and is then converted into zinc oxide while cooling. The heating temperature is an important factor which determines the amount of source material vaporized. As the heating temperature increases, the amount of gaseous zinc and oxygen increases. However, by increasing a kinetic energy of the vaporized gaseous zinc and oxygen, migration velocity and migration distance thereof can be increased. Accordingly, it is desirable to adequately determine the heating temperature according to the distance between the substrate and the vaporous source material. In Exemplary embodiments, the heating temperature is about 800 to about 1,000° C. The gaseous zinc and oxygen are partially converted into a zinc oxide gas, while being carried in this way. After reaching the substrate, the zinc oxide gas is adsorbed on the crystal surface of the seed layer arranged on the substrate and then grows into the nanowires. In an exemplary embodiment, the growth time of the zinc oxide nanowires is about 10 to about 60 minutes.

In addition to thermal chemical vapor deposition, hydrothermal synthesis is also used to produce microstructures in the form of nanoparticles, nanowires or nanorods. In accordance with the hydrothermal synthesis, zinc oxide nanowires are grown in an aqueous solution of a Zn precursor containing a Zn source and a functional adjuvant capable of producing a hydroxyl group (OH—). For example, zinc oxide nanowires are grown in the presence of an aqueous hexamethyltetramine (HMTA) adjuvant solution on a zinc oxide-coated substrate. For example, ZnO nanowires are prepared by reacting an aqueous solution of zinc nitrate hexahydrate $(Zn(NO_3)_2,$ $6H_2O$) as a Zn precursor and hexamethyltetramine solution (HMTA, $(CH_2)_6N_4$) as an adjuvant at a reaction temperature of about 90□. The reaction scheme is depicted as follows:

$$(CH_2)_6N_4 + 6H_2O \rightarrow 4NH_3 + 6HCHO \quad (1)$$

$$NH_3 + H_2O \rightarrow NH_4^+ + OH^- \quad (2)$$

$$Zn + 2NH_4^+ \rightarrow Zn^{2+} + 2NH_3 + H_2 \quad (3)$$

$$Zn^{2+} + 2OH^- \rightarrow ZnO(s) + H_2O \quad (4) \text{ (heating at 90□)}$$

In Exemplary embodiments, aligned nanowires can be mass-produced by epitaxially growing the nanowires perpendicular to the crystal surface of seeds obtained through pretreatment of the metal seed layer. Zinc oxide nanowires manufactured by the method of the Exemplary embodiments can realize electron mobility as high as 1,000 cm$^2$/Vs. Furthermore, when the top of the substrate is further treated, or a substrate having various structures is used, nanowires can be obtained which are grown perpendicular to the surface of the substrate or at an angle thereto.

As such, when aligned zinc oxide nanowires manufactured by the method of the Exemplary embodiments are used, the aligned nanowires can be grafted to various substrates and array-type integrated devices can be readily fabricated.

In another Exemplary embodiment, the invention provides a method of fabricating a device comprising zinc oxide nanowires. The device fabricating method comprises the manufacturing method of the zinc oxide nanowires according to the Exemplary embodiments.

Examples of the device comprising zinc oxide nanowires include, but are not limited to, thin film transistors, light-emitting diodes (LEDs), photonic devices, and the like.

Hereinafter, exemplary embodiments of the present invention will be described in further detail with reference to Examples. These Examples are set forth for the purposes of illustration only, but should not be construed as limiting the claimed invention.

EXAMPLES

Example 1

Figure 5A:
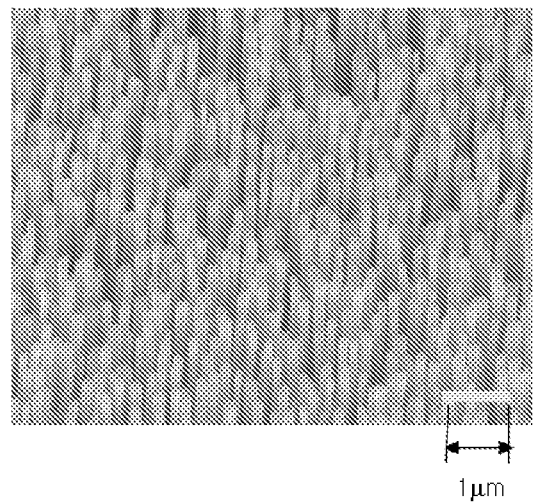
FIGS. 5a and 5b are scanning electron microscopy (SEM) images of zinc oxide nanowires manufactured in accordance with an exemplary embodiment of the present invention.
Figure 5B:
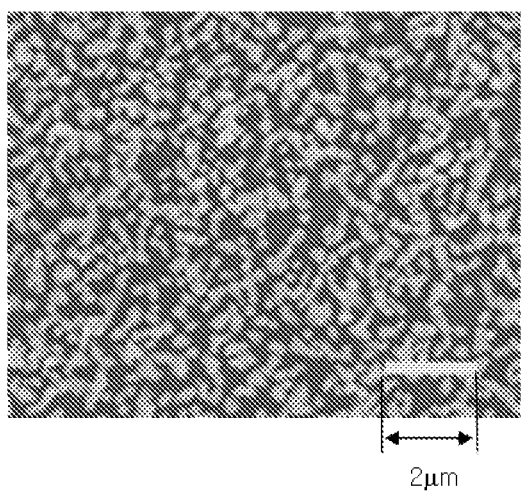
Figure 6:
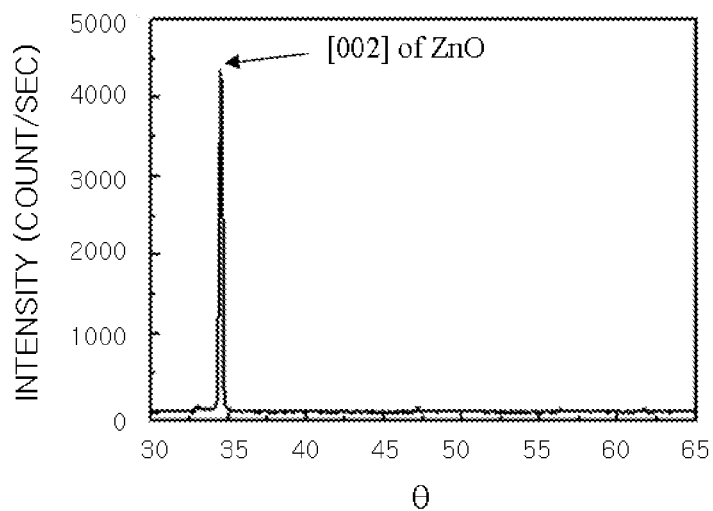
Figure 7:
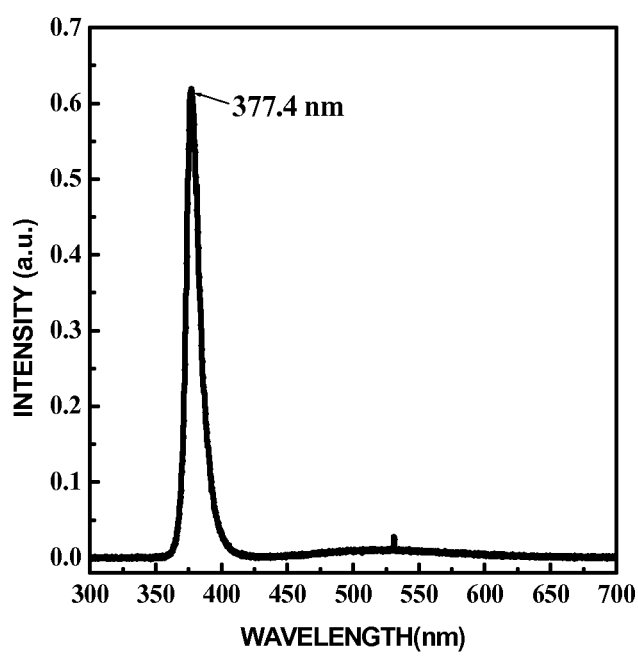

A zinc film was formed to a thickness of 30 nm by sputtering zinc on a silicon wafer substrate on which an amorphous silicon oxide (SiO$_2$) film is formed. The zinc film on the substrate was oxidized in a furnace at 400° C. for one hour under an oxygen atmosphere to form a zinc oxide film. The substrate provided with the zinc oxide film was subjected to thermal chemical vapor deposition to produce zinc oxide nanowires. At this time, a mixture consisting of 0.05 g of a zinc oxide powder and 0.05 g of a carbon powder was arranged at one side of the furnace. The substrate provided with the zinc oxide film was arranged to be spaced apart from the mixture by a distance of about 3 cm. As shown in FIG. 4, the mixture and the resulting structure were placed in thermal chemical vapor deposition equipment. A mixture of argon and oxygen was used as a carrier gas. While maintaining a flow rate of approximately 50 sccm, the furnace was heated at a temperature-elevating rate of 20□/min up to 950° C. and then allowed to hold at 950° C. for 30 minutes. After completion of the reaction, zinc oxide nanowires thus prepared were subjected to scanning electron microscopy (SEM) at the top and an oblique side. The SEM images are shown in FIGS. 5a and 5b. The crystallinity and optical properties of the zinc oxide nanowires were evaluated through X-ray diffraction (XRD) and photoluminescence (PL). The results are shown in FIGS. 6 and 7. It can be seen from FIG. 6 that the zinc oxide nanowires have grown in the <002> preferred direction.

Example 2 to 4

Figure 8A:
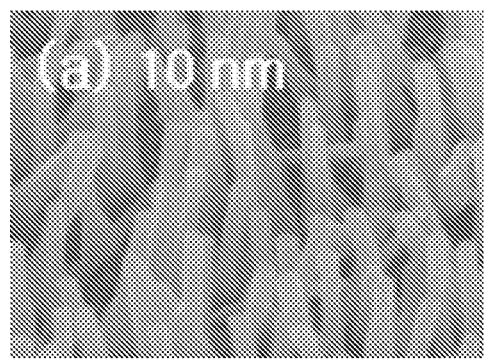
FIGS. 8a to 8c are scanning electron microscopy (SEM) images of the zinc oxide nanowires according to various thicknesses of the seed layer.
Figure 8B:
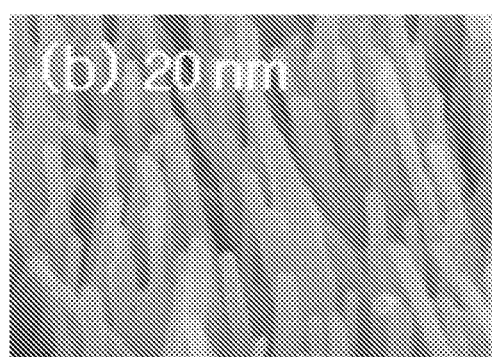
Figure 8C:
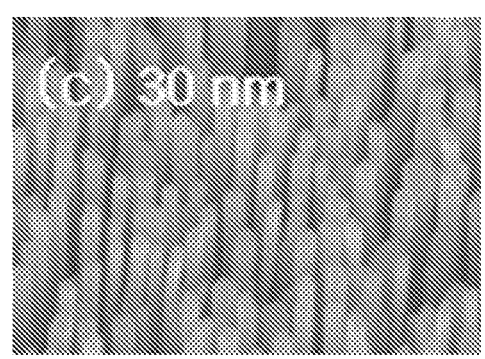
Figure 9:
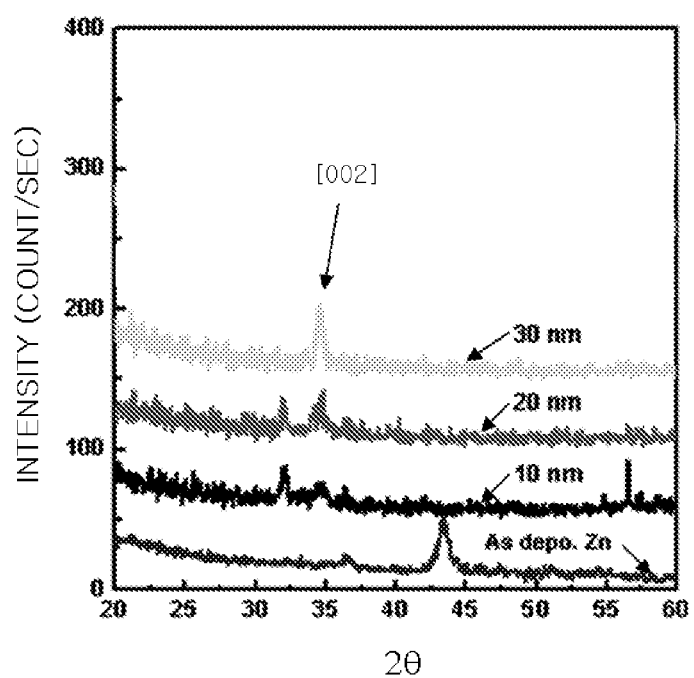

Zinc oxide nanowires were prepared in the same manner as in Example 1 except that the zinc film was formed to thicknesses of 10 nm, 20 nm and 30 nm. Zinc oxide nanowires thus prepared were subjected to scanning electron microscopy (SEM). The resulting SEM images are shown in FIGS. 8a to 8c. Furthermore, in the process of preparing the zinc oxide nanowires, the zinc oxide film obtained through oxidation of the zinc film was subjected to X-ray diffraction to observe crystal surfaces thereof. The X-ray diffraction is conducted through X-ray irradiation in a perpendicular direction. The XRD results are shown in FIG. 9.

As can be seen from FIGS. 8a and 8c, the alignment degree of zinc oxide nanowires is varied dependent upon the thickness of the seed layer. When the [002] plane is predominantly imparted to the pretreated seed layer, the zinc oxide nanowires exhibit superior alignment degree since zinc oxide nanowires are grown in the <002> preferred direction. Consequently, upon oxidation of the zinc film in the process of pretreating the seed layer, the thickness of the zinc film affects [002] crystal planes to be imparted to the seed layer. As can be confirmed from FIG. 9, there is a correlation between the thickness of the zinc film and the crystal plane thereof. The XRD results ascertained that the zinc film formed to a thickness of about 30 nm using a sputter has the best crystal planes and that the zinc oxide nanowires grown under these conditions exhibit the most superior alignment degree While exemplary embodiments of the present invention have been described in detail above, the embodiments are simply for the purposes of illustration. It will be understood by those skilled in the art that various modifications and their equivalents can be made in alternative exemplary embodiments without departing from the spirit and scope of exemplary embodiments of the present invention. Thus, the genuine scope of the technical protection of example embodiments should be defined by the technical spirit of the claims which follow.

What is claimed is:

1. A method of manufacturing zinc oxide nanowires comprising:
    forming a metal seed layer on a substrate, wherein the metal seed layer has a thickness of about 20 nm to 50 nm;
    pretreating the metal seed layer through thermal oxidation to form metal oxide crystals; and
    growing zinc oxide nanowires on the metal oxide crystals, the metal oxide crystals serving as seeds for the growth of the zinc oxide nanowires to be aligned in one direction with respect to the surface of the substrate; wherein the growth of the zinc oxide nanowires is carried out by thermal chemical vapor deposition or hydrothermal synthesis; further wherein the zinc oxide nanowires exhibit a greater degree of alignment relative to zinc oxide nanowires formed from a metal seed layer that has a thickness of less than about 20 nm.

2. The method according to claim 1, wherein the zinc oxide nanowires are epitaxially grown perpendicular to the surface of the substrate.

3. The method according to claim 1, wherein the thermal chemical vapor deposition is carried out using ZnO or a mixture of ZnO and a carbon powder as a deposition source.

4. The method according to claim 1, wherein the substrate is an amorphous substrate.

5. The method according to claim 1, wherein the substrate is an amorphous SiO$_2$-coated substrate.

6. The method according to claim 1, wherein the substrate is made of at least one material selected from the group consisting of silicon, glass, indium tin oxide (ITO), mica, graphite, molybdenum sulfide, copper, zinc, aluminum, stainless steel, magnesium, iron, nickel, gold, silver and plastics.

7. The method according to claim 1, wherein the formation of the metal seed layer is carried out by forming a zinc film on the substrate.

8. A device comprising the zinc oxide nanowires of claim 1.

9. The device according to claim 8, wherein the device is a thin film transistor, a light-emitting diode, or a photonic device.

* * * * *